(12) United States Patent
Shi et al.

(10) Patent No.: US 6,756,831 B2
(45) Date of Patent: Jun. 29, 2004

(54) WIDE DYNAMIC PULSE WIDTH MODULATION NEURON CIRCUIT

(75) Inventors: Bingxue Shi, Beijing (CN); Jewie Chen, Beijing (CN)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/064,558

(22) Filed: Jul. 26, 2002

(65) Prior Publication Data

US 2004/0017236 A1 Jan. 29, 2004

(51) Int. Cl.[7] .............................................. H03K 3/017
(52) U.S. Cl. ..................................... 327/172; 331/36 C
(58) Field of Search ................................ 327/170, 172, 327/173, 174, 175, 176, 178, 31; 326/99; 331/36 C

(56) References Cited

U.S. PATENT DOCUMENTS 6,169,433 B1 * 1/2001 Farrenkopf ................. 327/131
6,339,349 B1 * 1/2002 Rajagopalan ............... 327/131
2002/0121940 A1 * 9/2002 Chrissostomidis et al. .... 331/36 C

OTHER PUBLICATIONS

Fitzgerald et al., Basic Electrical Engineering, 1981, McGrawHill, 5th Edition, p. 627.*

* cited by examiner

Primary Examiner—Linh M. Nguyen
(74) Attorney, Agent, or Firm—Jiang Chyun IP Office

(57) ABSTRACT

A pulse width modulation (PWM) neuron circuit. The neuron circuit includes an input control circuit, a charge/discharge circuit and an output control circuit. The input control circuit is coupled to an input voltage source and an operation voltage source. The charge/discharge circuit is coupled to the current mirror circuit. The output control circuit is being coupled to the charge/discharge circuit and the input control circuit. The input control circuit is activated and controlled by the output control circuit and a first current is generated from the input control circuit in accordance with the input voltage source and the operation voltage source. The charge/discharge circuit is charged to a predetermined voltage level in accordance with the first current from the input control circuit. The predetermined voltage level is sufficient enough to make an output of the output control circuit being changed with logic status of the output.

5 Claims, 2 Drawing Sheets

——— fitted sigmoid
- - - simulated neuron activation function
- - - - - relative error between simulated function
  and fitted sigmoid

WIDE DYNAMIC PULSE WIDTH MODULATION NEURON CIRCUIT

BACKGROUND OF INVENTION

1. Field of Invention

The present invention relates to a pulse width modulation neuron circuit. More particularly, the present invention relates to pulse width modulation neuron circuit, in which its output pulse width realizes a sigmoid activation function of its voltage input, and power-down of some circuits of the neuron circuit in pulse interval will reduce the power assumption significantly.

2. Description of Related Art

As the most important block in the artificial neural network (ANNs), the behavior of the neuron has vast influence on the performance of the whole network. The sigmoid function is adopted as the activation function of artificial neuron popularly. Pulse stream approach is often used to realize the neuron with this function, which has a digital stream output as an analog information axis. There have been several kinds of pulse stream neuron circuits. Other existed circuits have various kinds of limitations, such as sensitivity to noise due to narrow dynamic range, and bulky size due to the complicated voltage integrator circuit and the operational amplifier in them. Furthermore, all these neuron circuits are not power-optimized.

SUMMARY OF INVENTION

The invention provides a novel compact pulse width modulation (PWM) neuron circuit, in which its output pulse width realizes a sigmoid activation function of its voltage input.

The invention provides a novel compact pulse width modulation (PWM) neuron circuit, in which the power-down of some circuits in pulse interval will reduce the power assumption greatly.

As embodied and broadly described herein, the invention provides a pulse width modulation (PWM) neuron circuit including an input control circuit, a charge/discharge circuit and an output control circuit. The input control circuit is coupled to an input voltage source and an operation voltage source. The charge/discharge circuit is coupled to the current mirror circuit. The output control circuit is being coupled to the charge/discharge circuit and the input control circuit. The input control circuit is activated and controlled by the output control circuit and a first current is generated from the input control circuit in accordance with the input voltage source and the operation voltage source. The charge/discharge circuit is charged to a predetermined voltage level in accordance with the first current from the input control circuit. The predetermined voltage level is sufficient enough to make an output of the output control circuit being changed with logic status of the output.

In the above-mentioned pulse width modulation (PWM) neuron circuit, further includes a current mirror circuit. The current mirror circuit is interposed between the input control circuit and the charge/discharge circuit. The first current of the input control circuit is mirrored by a second current generated by the charge/discharge circuit.

In the above-mentioned pulse width modulation (PWM) neuron circuit, the charge/discharge circuit comprises a capacitor and a first transistor. The capacitor is charged by the second current and discharged when the first transistor being turned on.

In the above-mentioned pulse width modulation (PWM) neuron circuit, the first transistor is controlled by the output of the output control circuit.

In the above-mentioned pulse width modulation (PWM) neuron circuit, the input control circuit comprises a second transistor. A gate of the second transistor is coupled to and controlled by the output of the output control circuit.

In the above-mentioned pulse width modulation (PWM) neuron circuit, the input control circuit further comprises a third transistor (M1), one of a pair of source/drain regions of the third transistor being coupled to one of a pair of source/drain regions of the second transistor; a forth transistor (M2), one of a pair of source/drain regions of the forth transistor being coupled to the other of the source/drain regions of the third transistor and the first current; a fifth transistor (M3), one of a pair of source/drain regions of the fifth transistor being coupled to the other of the source/drain regions of the forth transistor and being coupled to a gate of the fifth transistor and a gate of the third transistor, the other source/drain region of the fifth transistor being coupled to the operation voltage source; and a sixth transistor, one of a pair of source/drain regions of the sixth transistor being coupled to a gate of the forth transistor and the other source/drain region of the fifth transistor being coupled to the input voltage source, a gate of the fifth transistor being coupled to the operation voltage source.

In the above-mentioned pulse width modulation (PWM) neuron circuit, the output control circuit comprises a 3-port NOR gate. The 3-port NOR gate controls the output of the output control circuit. One port of the 3-port NOR gate is coupled to a operation clock signal. One port of the 3-port NOR gate is coupled to the capacitor. When the operation clock signal is on a logic high status, the output of the output control circuit is changed its logic status when the capacitor is charged to or over the predetermined voltage level.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The invention provides a novel compact pulse width modulation (PWM) neuron circuit, in which its output pulse width realizes a sigmoid activation function of its voltage input. The dynamic range of the activation voltage can be ($V_{Tn}$, $V_{DD}-T_{Tn}$), here $V_{Tn}$ is the threshold voltage of the NMOS transistor. Moreover, the transfer function is symmetrical about the supply voltage and the ground. By using special techniques, the invention has very low power dissipation. All these merits ensure its suitability for large-scale integration.

Figure 1:
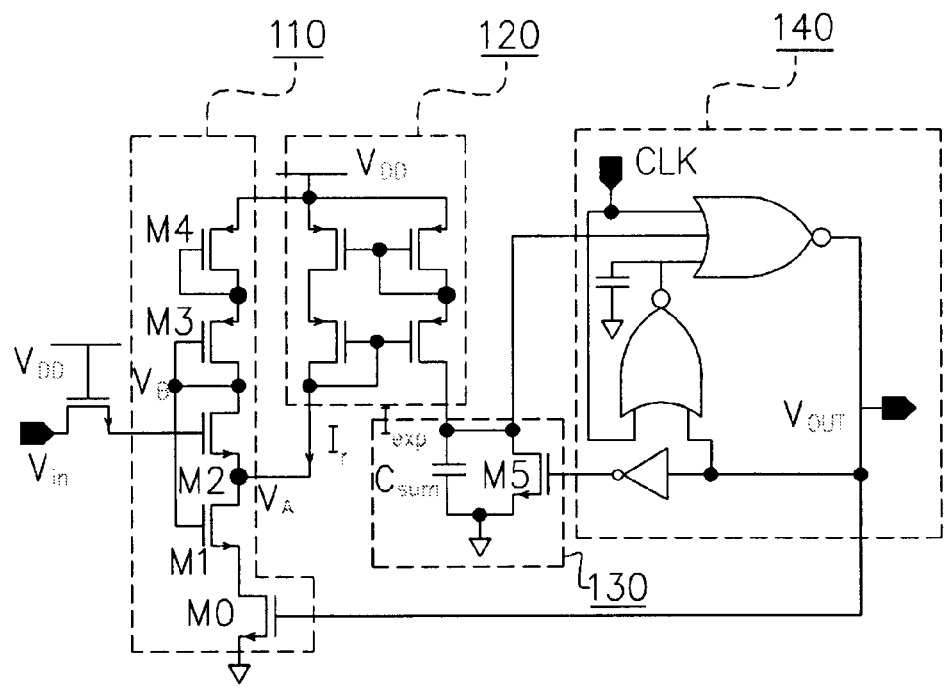
FIG. 1 is a schematic diagram of a preferred embodiment of a neuron circuit of the invention.

Refer to FIG. 1, showing a schematic diagram of a preferred embodiment of a neuron circuit of the invention. The neuron circuit includes an input control circuit 110, a current mirror circuit 120, a charge/discharge circuit 130 and an output control circuit 140. The input control circuit 110 is coupled to an input source ("$V_{in}$") and an operation voltage $V_{DD}$. The current mirror circuit 120 is coupled to the input control circuit 110 and the charge/discharge circuit 130. The currents $I_r$ and are applied to the current mirror circuit 120 respectively through the input control circuit 110 and the charge/discharge circuit 130. The current $I_{exp}$ is mirrored to the current $I_r$ by the current mirror circuit 120. The output control circuit 140 is coupled to the charge/discharge circuit 130 and the input control circuit 110. The input control circuit 110 is activated and controlled by the output control circuit 140 and the output current $I_r$ is generated therefrom. The current $I_r$ is generated in accordance with the input source $V_{in}$ and the operation voltage $V_{DD}$ under the control of the output control circuit 140. If the input control circuit 110 is not activated by the output control circuit 140, the output current $I_r$ of the input control circuit 110 will not be generated. That is, the input control circuit 110 and the current mirror circuit 120 are deactivated with no power, by which the circuit of the preferred embodiment provides a significant low power consumption circuit.

Refer to FIG. 1, the falling edge of the CLK fires the pulse at $V_{out}$, and this pulse turns transistor M0 on. Then current $I_r$ is gotten through the circuit in the input control circuit 110 corresponding to a special $V_{in}$ as well as current $I_{exp}$ through the current mirror circuit 120, for example, an Wilson current mirror circuit, shown in FIG. 1. $I_{exp}$ charges the capacitor $C_{sum}$ till its voltage reaches the threshold voltage $V_{thres}$ of the 3-input NOR gate, then $V_{out}$ charges to zero, and the pulse is finished, the turn-on of transistor M5 discharges $C_{sum}$ to ground at the same time. The time to drive the voltage on $C_{sum}$ from zero to $V_{thres}$ is equal to the pulse width.

Assuming $V_{in}$ keeps constant in the pulse duration period, pulse width T can be calculated by equation (1):

$$T = \frac{C_{sum} \cdot V_{thres}}{I_{exp}} \quad (1)$$

When M0 is turned on, there well be 5 states for $I_r$ as $V_{in}$ grows from ground to $V_{DD}$. It is assumed that the substrate bias modulation effect is ignored.

(1) When $V_{in} < V_{Tn}$, transistors M2, M3 and M4 shown in FIG. 1 are shut down. By properly selecting $k_0$, $k_1$ and $k_r$, which are the transconductance parameters of M0, M1 and the 2 PMOS transistors that carry $I_r$ in the current mirror circuit 120 respectively, $V_A$ can be pulled nearly to ground. Thus $I_r$ can be expressed as $$I_r \approx k_r \left( -\frac{V_{DD}}{2} - V_{Tp} \right)^2 \quad (2)$$

Corresponding to this state, the transfer function keeps at low saturation level.

(2) When $V_{in} > V_{Tn}$, the transistor M1 is unsaturated while the transistor M2 is saturated. Assuming the transistor M3 and M4 are identical, the current $I_{d3}$ that flows out the drain of the transistor M3, the drain current $I_{d2}$ and $I_{d1}$ of M2 and M1 respectively, and Ir satisfies following equations:

$$I_{d3} = k_3 \left( \frac{V_B - V_{DD}}{2} - V_{Tp} \right)^2 \quad (3)$$

$$I_{d2} = k_2 (V_{in} - V_A - V_{Tp})^2 \quad (4)$$

$$I_{d1} = k_1 [2(V_B - V_{Tn}) - V_A] \cdot V_A \quad (5)$$

$$I_r = k_r \left( \frac{V_A - V_{DD}}{2} - V_{Tp} \right)^2 \quad (6)$$

$$I_{d2} = I_{d3}, \quad I_r = I_{d1} - I_{d2} \quad (7)$$

By solving above equations, it can be found that $I_r$ decreases slowly with the increase of $V_{in}$.

(3) Both transistors M1 and M2 are saturated. Since $I_r$ is relatively small compared with $I_{d3}$ and $I_{d1}$, so equation (8) is tenable:

$$k_1(V_B - V_{Tn})^2 = I_{d1} \approx I_{d3} = k_3 \left( \frac{V_B - V_{DD}}{2} - V_{Tp} \right)^2 \quad (8)$$

Thus $V_B$ and $V_A$ can be depicted as $$V_B = \frac{V_{DD} + 2V_{TP} + 2\sqrt{k_1/k_3}\, V_{Tn}}{1 + 2\sqrt{k_1/k_3}} \quad (9)$$

$$V_A = V_{in} - \frac{k_3}{k_2} \left| \frac{V_B - V_{DD}}{2} - V_{Tp} \right| - V_{Tn} \quad (10)$$

$I_r$ decrease squarely with $V_A$ as equation (6) indicates.

(4) Transistor M2 becomes unsaturated while transistor M1 keeps saturated. $I_{d3}$ is almost fixed because of the clamp of $V_B$, and $V_A$ approaches a constant value near $V_B$, as $$I_{d2} = k_2 [(V_{in} - V_A - V_{Tn})^2 - (V_{in} - V_B - V_{Tn})^2] = I_{d3}$$

indicates. $I_r$ declines slowly with $V_{in}$.

(5) The gate voltage of transistor M2 is clamped to $V_{DD} - V_{Tn}$ and no longer follows the change of $V_{in}$ after $V_{in} > VDD - VTn$ due to the turn-off of the input NMOS switch. Thus, $I_r$ also keeps constant in the state, and the transfer function keeps at high saturation level.

$I_r$ is mirrored to $I_{exp}$ through the current mirror circuit 120, and a sigmoid function is realized between the activation voltage $V_{in}$ and the pulse width T.

It can be noticed that the output information is contained in the pulse width only and not in the pulse interval. When $V_{out}$ is low, the input control circuit 110 and the current mirror circuit 120 are useless. The power-down of these circuits in pulse interval will reduce the power assumption greatly. Transistor M0 is used in the embodiment to realize the target with $V_{out}$ as its gate voltage. When $V_{out}$ is zero, M0 is shut off, the input control circuit 110 and the current mirror circuit 120 are deactivated with no power consumption. Thus, the analog block is active periodically synchronized with the output pulse stream, and the turn-off of the analog block lessens the power dissipation in the pulse interval.

Figure 2:
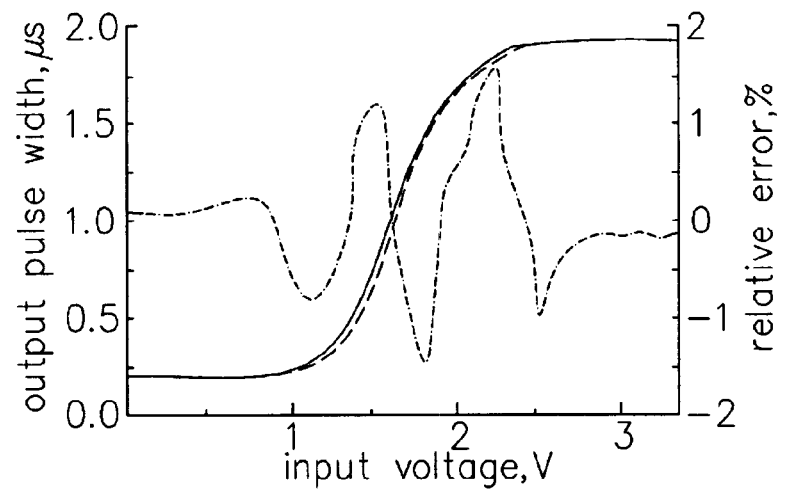
FIG. 2 is a schematic diagram showing an input voltage to a output pulse width and a relative error, in which a simulated neuron activation function compared with a fitted sigmoid and the relative error between the neuron activation function and the fitted sigmoid is introduced.

The embodiment of the invention is simulated using TSMC™ 0.35 um, 3.3V standard CMOS process with HSPICE. The neuron activation function and its fitted sigmoid curve are shown in FIG. 2. The activation function is at low saturation level before about 0.6V, which is $V_{Tn}$, and at high saturation level after about 2.7 V, which is $V_{DD}-V_{Tn}$. So the dynamic range is very wide compared to other circuits. Moreover, this activation function is symmetrical about the ground and the power supply. Refer to FIG. 2, showing the relative error is not more than 1.6%, so it realizes a very precise function.

Figure 3:
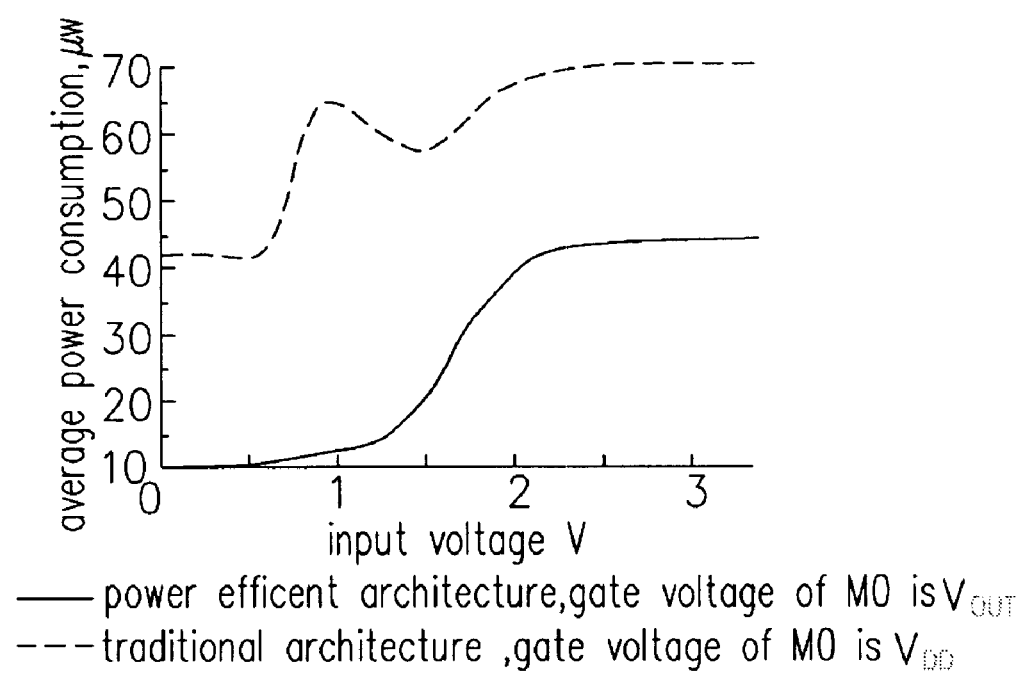
FIG. 3 is a schematic diagram showing an input voltage to an average power consumption, in which the average power consumption of the circuit of the preferred embodiment of the invention is compared with a conventional architecture.

Experiment also has been done to verify the effectiveness of the power efficient architecture, the average power consumption as the functions of activation voltage are plotted in FIG. 3. The average power of the circuit of the preferred embodiment of the invention with no power efficient architecture is measured with the gate voltage of M1 connected to power supply, as in the conventional design. The maximum, minimum and the mean value under random activation voltage of the average power dissipation are 43.0 uW, 10.5 uW and 27.0 uW respectively after the adoption of the power efficient architecture. Compared with those values of 69.3 uW, 41.7 uW and 59.9 uW respectively before this architecture is adopted, the reduction are 38%, 75% and 55% respectively. So it can be concluded that this circuit reduces its power dissipation dramatically.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pulse width modulation (PWM) neuron circuit, comprising:
    an input control circuit, being coupled to an input voltage source and an operation voltage source;
    a charge/discharge circuit;
    a current mirror circuit, being interposed between the input control circuit and the charge/discharge circuit; and
    an output control circuit, being coupled to the charge/discharge circuit and the input control circuit, wherein the input control circuit is activated and controlled by the output control circuit and a first current is generated from the input control circuit in accordance with the input voltage source and the operation voltage source, the charge/discharge circuit being charged to a predetermined voltage level in accordance with the first current from the input control circuit, the predetermined voltage level being sufficient enough to make an output of the output control circuit being changed with logic status of the output,
    wherein the first current of the input control circuit being mirrored by a second current generated by the charge/discharge circuit.

2. The pulse width modulation (PWM) neuron circuit of claim 1, wherein the charge/discharge circuit comprises a capacitor and a first transistor, the capacitor being charged by the second current and discharged when the first transistor being turned on.

3. The pulse width modulation (PWM) neuron circuit of claim 2, wherein the first transistor is controlled by the output of the output control circuit.

4. A pulse width modulation (PWM) neuron circuit, comprising:
    an input control circuit, being coupled to an input voltage source and an operation voltage source;
    a charge/discharge circuit, being coupled to a current mirror circuit; and
    an output control circuit, being coupled to the charge/discharge circuit and the input control circuit, wherein the input control circuit is activated and controlled by the output control circuit and a first current is generated from the input control circuit in accordance with the input voltage source and the operation voltage source, the charge/discharge circuit being charged to a predetermined voltage level in accordance with the first current from the input control circuit, the predetermined voltage level being sufficient enough to make an output of the output control circuit being changed with logic status of the output,
    wherein the input control circuit further comprising:
        a second transistor, a gate of the second transistor being coupled to and controlled by the output of the output control circuit;
        a third transistor (M1), one of a pair of source/drain regions of the third transistor being coupled to one of a pair of source/drain regions of the second transistor;
        a fourth transistor (M2), one of a pair of source/drain regions of the fourth transistor being coupled to the other of the source/drain regions of the third transistor and the first current;
        a fifth transistor (M3), one of a pair of source/drain regions of the fifth transistor being coupled to the other of the source/drain regions of the fourth transistor and being coupled to a gate of the fifth transistor and a gate of the third transistor, the other source/drain region of the fifth transistor being coupled to the operation voltage source; and
        a sixth transistor, one of a pair of source/drain regions of the sixth transistor being coupled to a gate of the fourth transistor and the other source/drain region of the fifth transistor being coupled to the input voltage source, a gate of the fifth transistor being coupled to the operation voltage source.

5. A pulse width modulation (PWM) neuron circuit, comprising:
    an input control circuit, being coupled to an input voltage source and an operation voltage source;
    a charge/discharge circuit, being coupled to a current minor circuit; and
    an output control circuit, being coupled to the charge/discharge circuit and the input control circuit, wherein the input control circuit is activated and controlled by the output control circuit and a first current is generated from the input control circuit in accordance with the input voltage source and the operation voltage source, the charge/discharge circuit being charged to a predetermined voltage level in accordance with the first current from the input control circuit, the predetermined voltage level being sufficient enough to make an output of the output control circuit being changed with logic status of the output,
    wherein the output control circuit comprises a 3-port NOR gate, the 3-port NOR gate controlling the output of the output control circuit, wherein one port of the 3-port NOR gate being coupled to a operation clock signal, one port of the 3-port NOR gate being coupled to the capacitor, when the operation clock signal being on a logic high status, the output of the output control circuit being changed its logic status when the capacitor being charged to or over the predetermined voltage level.

* * * * *